United States Patent
Zhang et al.

(10) Patent No.: US 9,575,095 B2
(45) Date of Patent: Feb. 21, 2017

(54) LOW POWER HIGH RESOLUTION OSCILLATOR BASED VOLTAGE SENSOR

(71) Applicant: QUALCOMM Incorporated, San Diego, CA (US)

(72) Inventors: Junmou Zhang, San Diego, CA (US); Chuang Zhang, San Diego, CA (US); Yuancheng Christopher Pan, Saratoga, CA (US); Nan Chen, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 226 days.

(21) Appl. No.: 14/459,208

(22) Filed: Aug. 13, 2014

(65) Prior Publication Data
US 2016/0047847 A1    Feb. 18, 2016

(51) Int. Cl.
G01R 23/02 (2006.01)
G01R 19/00 (2006.01)
G01R 31/28 (2006.01)
G01R 19/165 (2006.01)

(52) U.S. Cl.
CPC ..... G01R 19/0084 (2013.01); G01R 19/16552 (2013.01); G01R 23/02 (2013.01); G01R 31/282 (2013.01)

(58) Field of Classification Search
CPC ........ G01R 19/252; G01R 23/10; H02M 1/60; H02M 1/607; H03L 7/08; H03L 7/93; H03L 7/156; H03L 7/802; H03L 7/891
See application file for complete search history.

(56) References Cited

U.S. PATENT DOCUMENTS

| 5,841,301 A * | 11/1998 | Horie ............... H03K 5/086 327/100 |
| 6,882,238 B2 * | 4/2005 | Kurd ................ G01K 7/32 331/185 |
| 7,332,973 B2 | 2/2008 | Lee et al. |
| 8,368,385 B2 | 2/2013 | Barton et al. |
| 8,390,313 B2 | 3/2013 | Ikenaga et al. |
| 8,497,694 B2 | 7/2013 | Chua-Eoan et al. |

(Continued)

FOREIGN PATENT DOCUMENTS

WO    2013089744 A1    6/2013

OTHER PUBLICATIONS

Alon E., et al., "On-Die Power Supply Noise Measurement Techniques", IEEE Transactions on Advanced Packaging, IEEE, vol. 32, No. 2, 2009, pp. 248-259.

(Continued)

Primary Examiner — Minh N Tang
(74) Attorney, Agent, or Firm — Loza & Loza LLP (57) ABSTRACT

Systems and methods for sensing voltage on a chip are described herein. In one embodiment, a voltage sensor comprises a voltage-controlled oscillator coupled to a voltage being sensed, and a plurality of transition detectors, wherein each of the transition detectors is coupled to a different location on the oscillator, and wherein each of the transition detectors is configured to count a number of transitions at the respective location over a time period. The voltage sensor also comprises an adder configured to add the numbers of transitions from the transition detectors to generate an output value that is approximately proportional to the voltage.

35 Claims, 9 Drawing Sheets

(56) References Cited

U.S. PATENT DOCUMENTS

| | | |
|---|---|---|
| 8,593,171 B2 | 11/2013 | Kosonocky et al. |
| 2003/0056124 A1 | 3/2003 | Amick et al. |
| 2011/0074398 A1* | 3/2011 | Barton ............... G01R 19/0084 |
| | | 324/133 |
| 2014/0145707 A1 | 5/2014 | Tanabe et al. |

OTHER PUBLICATIONS

Farahat M.A., et al., "Only Digital Technology Analog-to-Digital Converter Circuit", IEEE 46th Midwest Symposium on Circuits and Systems, vol. 1, 2003, pp. 178-181.

Ogasahara Y., et al., "All-Digital Ring-Oscillator-Based Macro for Sensing Dynamic Supply Noise Waveform", IEEE Journal of Solid-State Circuits, vol. 44, No. 6, Jun. 2009, pp. 1745-1755.

Vijayakumar A., et al., "On Design of Low Cost Power Supply Noise Detection Sensor for Microprocessors", IEEE Computer Society Annual Symposium on VLSI (ISVLSI), 2012, pp. 120-125.

International Search Report and Written Opinion—PCT/US2015/035674—ISA/EPO—Sep. 17, 2015.

* cited by examiner

FIG. 9

LOW POWER HIGH RESOLUTION OSCILLATOR BASED VOLTAGE SENSOR

BACKGROUND

Field

Aspects of the present disclosure relate generally to voltage sensing, and more particularly, to voltage sensors.

Background

There is a trend to reduce the power supply voltage of mobile devices to reduce power consumption. However, lowering the power supply voltage increases the problem of voltage droop (e.g., due to power gating) and noise (e.g., due to clock switching). Voltage droop may cause logic failure in a device and/or the device to unexpectedly shut down.

In this regard, voltage sensors may be integrated on a chip to monitor the power supply voltage at various locations on the chip. The voltage readings from the sensors may be used, for example, to debug a chip by identifying voltage waveforms indicative of a failure in the chip. The voltage readings may also be used for adaptive clocking to prevent the power supply voltage from becoming too low. In this application, when the supply voltage falls below a voltage threshold, the clock frequency of a circuit (e.g., central processing unit (CPU)) may be reduced (throttled back) to increase the supply voltage. The voltage readings may also be used to verify that a model of the power distribution network (PDN) of the device is accurate.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a voltage sensor is described herein. The voltage sensor comprises a voltage-controlled oscillator coupled to a voltage being sensed, and a plurality of transition detectors, wherein each of the transition detectors is coupled to a different location on the oscillator, and wherein each of the transition detectors is configured to count a number of transitions at the respective location over a time period. The voltage sensor also comprises an adder configured to add the numbers of transitions from the transition detectors to generate an output value that is approximately proportional to the voltage.

A second aspect relates to a method for sensing a voltage. The method comprises inputting the voltage to a voltage-controlled oscillator, counting a number of transitions at each one of a plurality of different locations on the oscillator over a time period, and adding the numbers of transitions for the different locations to generate an output value that is approximately proportional to the voltage.

A third aspect relates to an apparatus for sensing a voltage. The apparatus comprises means for inputting the voltage to a voltage-controlled oscillator, means for counting a number of transitions at each one of a plurality of different locations on the oscillator over a time period, and means for adding the numbers of transitions for the different locations to generate an output value that is approximately proportional to the voltage.

A fourth aspect relates to a system comprising a voltage sensor and a voltage management device. The voltage sensor comprises a voltage-controlled oscillator coupled to a voltage being sensed, and a plurality of transition detectors, wherein each of the transition detectors is coupled to a different location on the oscillator, and wherein each of the transition detectors is configured to count a number of transitions at the respective location over a time period. The voltage sensor also comprises an adder configured to add the numbers of transitions from the transition detectors to generate an output value that is approximately proportional to the voltage. The voltage management device is configured to estimate the voltage based on the output value, and to adjust an operating frequency of a circuit based on the estimated voltage.

To the accomplishment of the foregoing and related ends, the one or more embodiments comprise the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the described embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

There is a trend to reduce the power supply voltage of mobile devices to reduce power consumption. However, lowering the power supply voltage increases the problem of voltage droop (e.g., due to power gating) and noise (e.g., due to clock switching). Voltage droop may cause logic failure in a device and/or the device to unexpectedly shut down.

In this regard, voltage sensors may be integrated on a chip to monitor the power supply voltage at various locations on the chip. The voltage readings from the sensors may be used, for example, to debug a chip by identifying voltage waveforms indicative of a failure in the chip. The voltage readings may also be used for adaptive clocking to prevent the power supply voltage from becoming too low. In this application, when the supply voltage falls below a voltage threshold, the clock frequency of a circuit (e.g., central processing unit (CPU)) may be reduced (throttled back) to increase the supply voltage. The voltage readings may also be used to verify that a model of the power distribution network (PDN) of the device is accurate.

Figure 1:
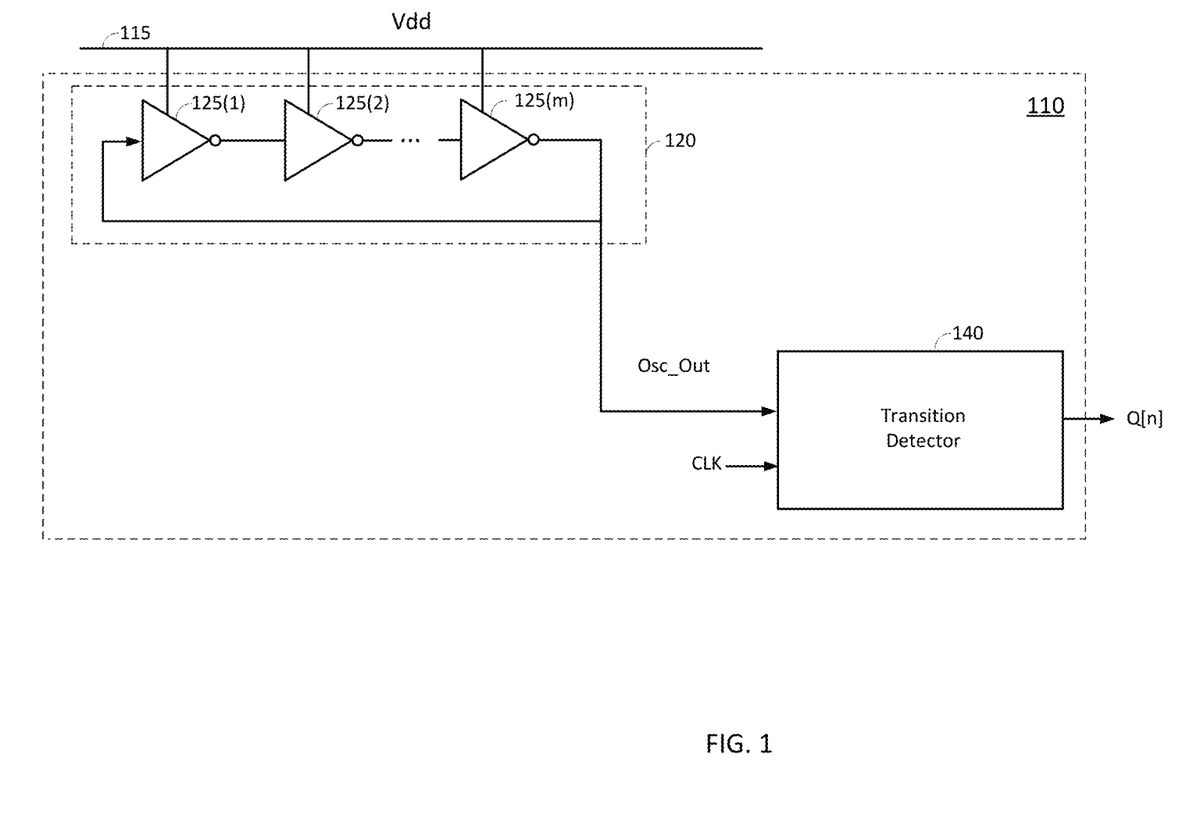
FIG. 1 shows a voltage sensor according to an embodiment of the present disclosure.

FIG. 1 shows a voltage sensor 110 according to an embodiment of the present disclosure. The voltage sensor 110 comprises a voltage-controlled oscillator 120, and a transition detector 140. The oscillator 120 is coupled to the voltage being measured. For example, the oscillator 120 may be coupled to a power supply rail 115 to measure the corresponding supply voltage Vdd, as shown in FIG. 1.

In one embodiment, the oscillator 120 may be a ring oscillator comprising an odd number of inverters 125(1)-125(m) coupled into a delay chain, where each inverter is biased by the supply voltage Vdd. The output of the last inverter 125(m) in the delay chain is coupled to the input of the first inverter 125(1) in the delay chain to form a closed loop. This causes the oscillator 120 to oscillate at a frequency that is a function of the supply voltage Vdd. The frequency of the oscillator 120 may be given by:

$$f_{osc} = K_{vdd} V_{dd} \tag{1}$$

where $f_{osc}$ is the frequency of the oscillator 120, and $K_{vdd}$ is a voltage-to-frequency coefficient of the oscillator 120. As shown in equation (1), the oscillation frequency $f_{osc}$ is approximately a linear function of the supply voltage Vdd over a certain voltage range.

The oscillation frequency in equation (1) may be converted into a phase that is a function of the supply voltage Vdd by integrating the oscillation frequency over time as follows:

$$\theta[n] = 2\pi \int_0^{nT} K_{vdd} V_{dd} dt \tag{2}$$

where T is one cycle of a reference clock signal, and $\theta[n]$ is the phase of the oscillator 120 in radians at time nT. The phase of the oscillator 120 over one clock cycle may be determined by taking the difference between the phase $\theta[n]$ at time nT and the phase $\theta[n-1]$ at time (n-1)T as follows:

$$\theta[n] - \theta[n-1] = 2\pi K_{vdd} V_{dd} T \tag{3}$$

In equation (3), Vdd represents the average supply voltage over one clock cycle. Thus, the phase of the oscillator 120 over one clock cycle is related to the supply voltage Vdd by the factor $2\pi K_{vdd}T$. This relationship may be used to estimate the supply voltage Vdd from the output of the voltage sensor 110, as discussed further below.

The transition detector 140 is configured to detect a number of transitions (rising and/or falling edges) at an output (denoted "Osc_Out") of the oscillator 120 over one cycle of the reference clock signal (denoted "CLK"). The reference clock signal provides a stable time reference for counting detected transitions, as discussed further below. For example, the clock signal may be generated by a phase locked loop (PLL) and/or a crystal oscillator.

In one embodiment, the transition detector 140 detects both rising and falling edges at the oscillator output Osc_Out. In this embodiment, a detected transition may be a rising edge or a falling edge. A rising edge may correspond to a transition from a low logic state (logic zero) to a high logic state (logic one), and a falling edge may correspond to a transition from a high logic state (logic one) to a low logic state (logic zero). In another embodiment, the transition detector 140 only detects rising edges at the oscillator output Osc_Out. Thus, in this embodiment, each detected transition is a rising edge.

The output of the transition detector 140 (denoted "Q[n]") indicates the number of detected transitions over one clock cycle (period). For the embodiment in which the transition detector 140 detects both rising and falling edges, the output Q[n] indicates a number of detected rising and/or falling edges over one clock cycle. In this embodiment, the output Q[n] of the transition detector 140 corresponds to a quantized phase of $\pi Q[n]$ over one clock cycle. This is because one oscillation cycle corresponds to a phase of $2\pi$, and adjacent transitions are separated by approximately half an oscillation cycle. As a result, each detected transition corresponds to a phase increase of $\pi$ from the previous detected transition.

In this embodiment, the quantized phase $\pi Q[n]$ corresponding to the output of the transition detector 140 may be given by:

$$\pi Q[n] = (\theta[n] - \varnothing[n]) - (\theta[n-1] - \varnothing[n-1]) \tag{4}$$

where $\theta[n]$ is the actual phase at time nT, $\theta[n-1]$ is the actual phase at time (n-1)T, $\varphi[n]$ is a phase error at time nT due to quantization, and $\varphi[n-1]$ is a phase error at time (n-1)T due to quantization. The phase error is due to the fact that the actual phase is continuous while the quantized phase $\pi Q[n]$ quantizes the phase to a zero or a multiple of $\pi$. Equation (4) can be rearranged as follows:

$$\pi Q[n] = (\theta[n] - \theta[n-1]) - (\varnothing[n] - \varnothing[n-1]) \tag{5}$$

Substituting the expression for $\theta[n] - \theta[n-1]$ in equation (3) into equation (5) and dividing by $\pi$ yields:

$$Q[n] = 2K_{vdd} V_{dd} T + \frac{1}{\pi}(\varnothing[n] - \varnothing[n-1]). \tag{6}$$

Taking the Z-transform of equation (6) yields:

$$Q(z) = 2K_{vdd} V_{dd} T + \frac{1}{\pi}\varnothing(z)(z^{-1} - 1). \tag{7}$$

Thus, the output of the transition detector 140 is related to the average supply voltage Vdd over one clock period by the factor $2K_{vdd}T$ with a quantization error $\varnothing(z)$ that is first-order shaped. As a result, the output Q[n] of the transition detector 140 can be used to estimate the supply voltage Vdd based on equation (6) with some degree of quantization error.

For the embodiment in which the transition detector 140 only detects rising edges, the output Q[n] indicates the number of detected rising edges over one clock cycle. In this embodiment, the output Q[n] of the transition detector 140 corresponds to a quantized phase of $2\pi Q[n]$ over one clock cycle. This is because one oscillation cycle corresponds to a phase of 2π, and adjacent rising edges are separated by approximately one oscillation cycle. As a result, in this embodiment, each detected transition (i.e., detected rising edge) corresponds to a phase increase of 2π from the previous detected transition (i.e., previous detected rising edge).

In this embodiment, the quantized phase 2πQ[n] corresponding to the output of the transition detector 140 may be given by:

$$2\pi Q[n] = (\theta[n] - \emptyset[n]) - (\theta[n-1] - \emptyset[n-1]) \quad (8)$$

where θ[n] is the actual phase at time nT, θ[n−1] is the actual phase at time (n−1)T, ϕ[n] is a phase error at time nT due to quantization, and ϕ[n−1] is a phase error at time (n−1)T due to quantization. Equation (8) can be rearranged as follows:

$$2\pi Q[n] = (\theta[n] - \theta[n-1]) - (\emptyset[n] - \emptyset[n-1]) \quad (9)$$

It is to be appreciated that the phase error in equation (9) may have a different value than the phase error in equation (5) since the quantization is different. Substituting the expression for θ[n]−θ[n−1] in equation (3) into equation (9) and dividing by 2π yields:

$$Q[n] = K_{vdd}V_{dd}T + \frac{1}{2\pi}(\emptyset[n] - \emptyset[n-1]). \quad (10)$$

Taking the Z-transform of equation (10) yields:

$$Q(z) = K_{vdd}V_{dd}T + \frac{1}{2\pi}\emptyset(z)(z^{-1} - 1). \quad (11)$$

Thus, in this embodiment, the output of the transition detector 140 is related to the average supply voltage Vdd over one clock cycle by the factor $K_{vdd}T$ with a quantization error Ø(z) that is first-ordered shape. As a result, the output Q[n] of the transition detector 140 can be used to estimate the supply voltage Vdd based on equation (10) with some degree of quantization error.

Figure 2:
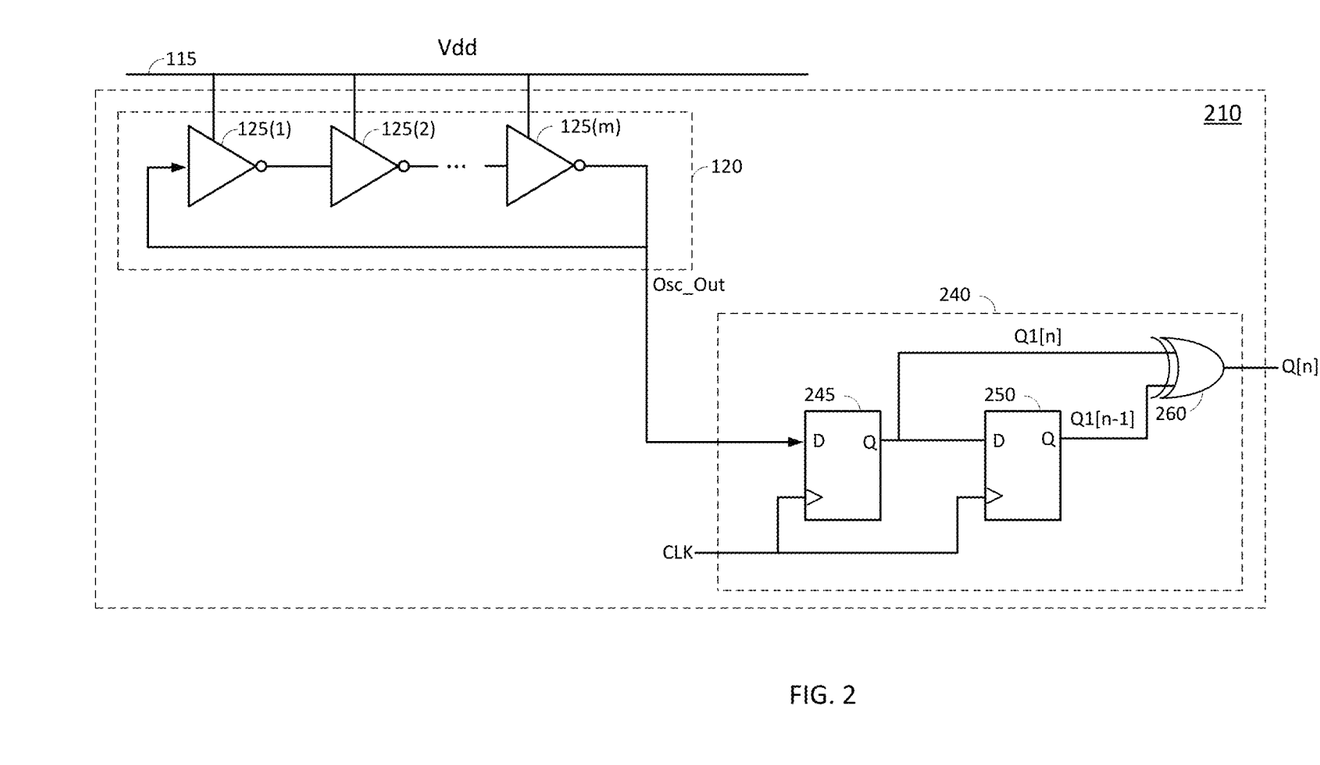
FIG. 2 shows an exemplary implementation of a transition detector according to an embodiment of the present disclosure.

FIG. 2 shows an exemplary implementation of a transition detector 240 according to an embodiment of the present disclosure. In this embodiment, the transition detector 240 is a one-bit transition detector capable of detecting up to one transition (rising edge or falling edge) during one clock cycle (period).

The transition detector 240 comprises a first latch 245 (e.g., D flip-flop), a second latch 250 (D flip-flop), and an XOR gate 260. The first latch 245 has an input (denoted "D") coupled to the output Osc_Out of the oscillator 120, a clock input coupled to the clock signal, and an output (denoted "Q"). The second latch 250 has an input (denoted "D") coupled to the output of the first latch 245, a clock input coupled to the clock signal, and an output (denoted "Q"). The output of the first latch 245 is coupled to a first input of the XOR gate 260, and the output of the second latch 250 is coupled to a second input of the XOR gate 260. The XOR gate 260 is configured to output a logic one if the logic states at the outputs of the first and second latches 245 and 250 are different, and to output a logic zero if the logic states at the outputs of the first and second latches 245 and 250 are the same. The output of the XOR gate 260 provides the output of the transition detector 240.

In one aspect, the first latch 245 is configured to latch the logic state at the oscillator output Osc_Out on each rising edge of the clock signal. The first latch 245 outputs each latched logic state at its output until the next rising edge of the clock signal (outputs each latched logic state for approximately one clock cycle). The second latch 250 is configured to latch the logic state at the output of the first latch 245 on each rising edge of the clock signal. The second latch 250 outputs each latched logic state at its output until the next rising edge of the clock signal.

There is a short delay between the time the first latch 245 latches the logic state at the oscillator output Osc_Out on a rising edge of the clock signal and the time the latched logic state appears at the output of the first latch 245. As a result, when the second latch 250 latches the logic state at the output of the first latch 245 on the rising edge of the clock signal, the logic state corresponds to the logic state at the oscillator output Osc_Out that was latched by the first latch 245 on the previous rising edge of the clock signal. Thus, the output of the second latch 250 lags behind the output of the first latch 245 by one clock cycle.

Consequently, the logic states at the outputs of the first and second latches 245 and 250 are different if there is a transition at the oscillator output Osc_Out during a clock cycle (period). The transition can be either a rising edge or a falling edge. Since the XOR gate 260 outputs a logic one if the logic states at the outputs of the first and second latches 245 and 250 are different, the XOR gate 260 outputs a logic one if there is a transition at the oscillator output Osc_Out during the clock cycle. The logic states at the outputs of the first and second latches 245 and 250 are the same if there is no transition at the oscillator output Osc_Out during the clock cycle. Since the XOR gate 260 outputs a logic zero if the logic states at the outputs of the first and second latches 245 and 250 are the same, the XOR gate 260 outputs a logic zero if there is no transition at the oscillator output Osc_Out during the clock cycle.

Thus, the output Q[n] of the transition detector 240 equals one if a transition (a rising edge or a falling edge) is detected during a clock cycle and equals zero if no transition is detected during a clock cycle (assuming there is no more than one transition during a clock cycle). In this embodiment, the transition detector 240 is capable of detecting one transition during a clock cycle, in which the detected transition can be either a rising edge or a falling edge. Thus, in this embodiment, a detected transition corresponds to a phase of π, and the output Q[n] of the transition detector 240 corresponds to a quantized phase of πQ[n]. As a result, the output Q[n] of the transition detector 240 is related to the supply voltage Vdd by the factor $2K_{vdd}T$ with a quantization error, as shown in equation (6) discussed above. Since the transition detector 240 in this embodiment detects up to one transition during a clock cycle, the transitions detector 240 quantizes the phase of the oscillator 120 over one clock cycle to either zero or π. In this embodiment, the voltage-to-frequency coefficient $K_{vdd}$ of the oscillator 120 and/or the period of the clock signal may be chosen such that no more than one transition occurs during one clock cycle over a voltage range of interest (voltage range being measured).

Figure 3:
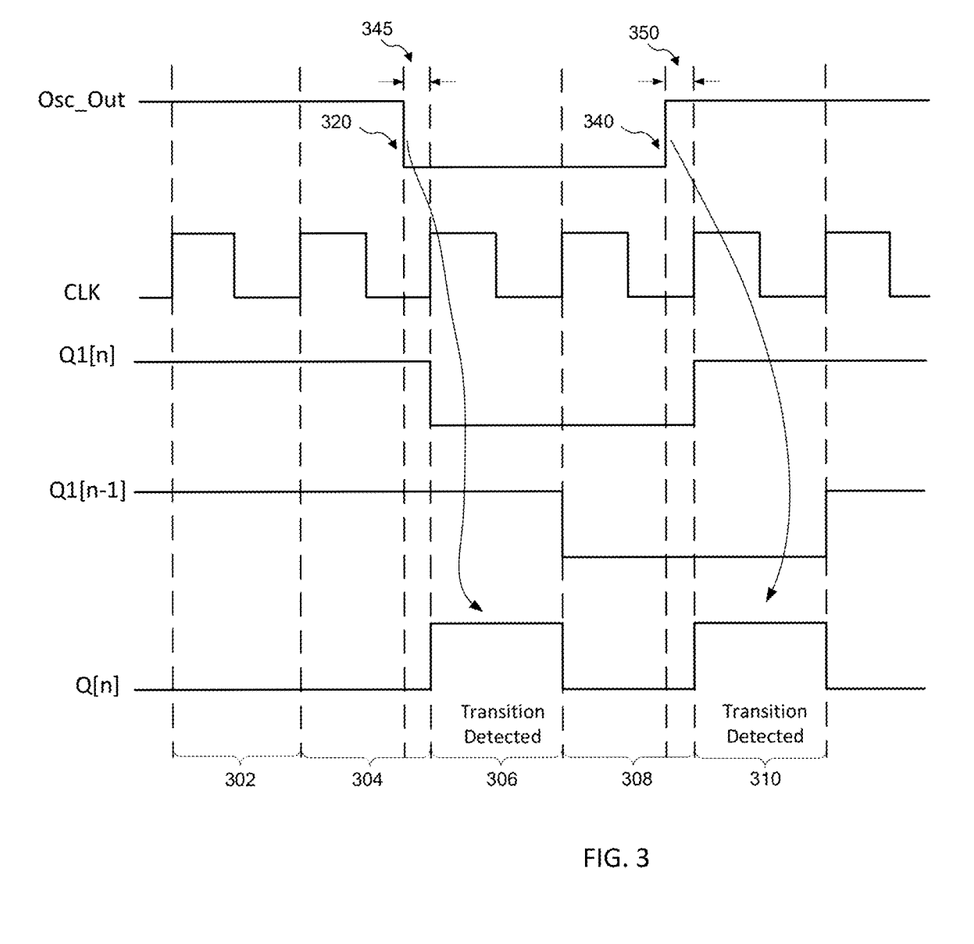
FIG. 3 is a plot illustrating exemplary waveforms for a voltage sensor according to an embodiment of the present disclosure.

FIG. 3 is a plot illustrating exemplary waveforms for the oscillator output Osc_Out, the clock signal CLK, the output of the first latch 245 (denoted "Q1[n]"), the output of the second latch 250 (denoted "Q1[n−1]"), and the output Q[n] of the transition detector 240 according to an embodiment of the present disclosure. In this example, the logic state at the oscillator output Osc_Out is a logic one during a first clock cycle 302. During a second clock cycle 304, the oscillator output Osc_Out transitions 320 from logic one to logic zero (falling edge). This causes the first latch 245 to output a logic zero during a third clock cycle 306. The second latch 250 outputs a logic one during the third clock cycle 306 since the output of the second latch 250 lags behind the output of the first latch 245 by one clock cycle. As a result, the transition detector 240 outputs a logic one during the third cycle 306, indicating detection of the transition.

During a fourth clock cycle 308, the oscillator output Osc_Out transitions 340 from logic zero to logic one (rising edge). This causes the first latch 245 to output a logic one during a fifth clock cycle 310. The second latch 250 outputs a logic zero during the fifth clock cycle 310 since the output of the second latch 250 lags behind the output of the first latch 245 by one clock cycle. As a result, the transition detector 240 outputs a logic one during the fifth cycle 310, indicating detection of the transition. In this embodiment, the transition detector 240 outputs a logic one for a detected transition regardless of whether the transition is a rising edge or a falling edge.

As shown in FIG. 3, there is a delay between the time that the transition 320 at the oscillator output Osc_Out occurs during the second clock cycle 304, and the time that the transition is detected by the transition detector 240. This is because the transition detector 240 does not detect the transition until the rising edge of the third clock cycle 306. The delay results in a phase error 345 that is approximately proportional to the delay. The longer the delay, the greater the phase error. For example, if the delay is approximately equal to 1/10 of an oscillation cycle, then the phase error may be approximately $2\pi/10$. The phase error corresponds to the phase error in equation (5) discussed above. In other words, the phase error is due to the fact the transition detector 240 is able to detect that the transition 320 occurred during the second clock cycle 304, but not the time the transition 320 occurred within the second clock cycle 304. As a result, the transition detector 240 is not able to determine the phase between the transition 320 and the rising edge of the third clock cycle 306 (i.e., time at which the transition detector 240 detects the transition).

Similarly, there is a delay between the time that the transition 340 at the oscillator output Osc_Out occurs during the fourth clock cycle 308, and the time that the transition is detected by the transition detector 240. The delay results in a phase error 350 that is approximately proportional to the delay.

Figure 4:
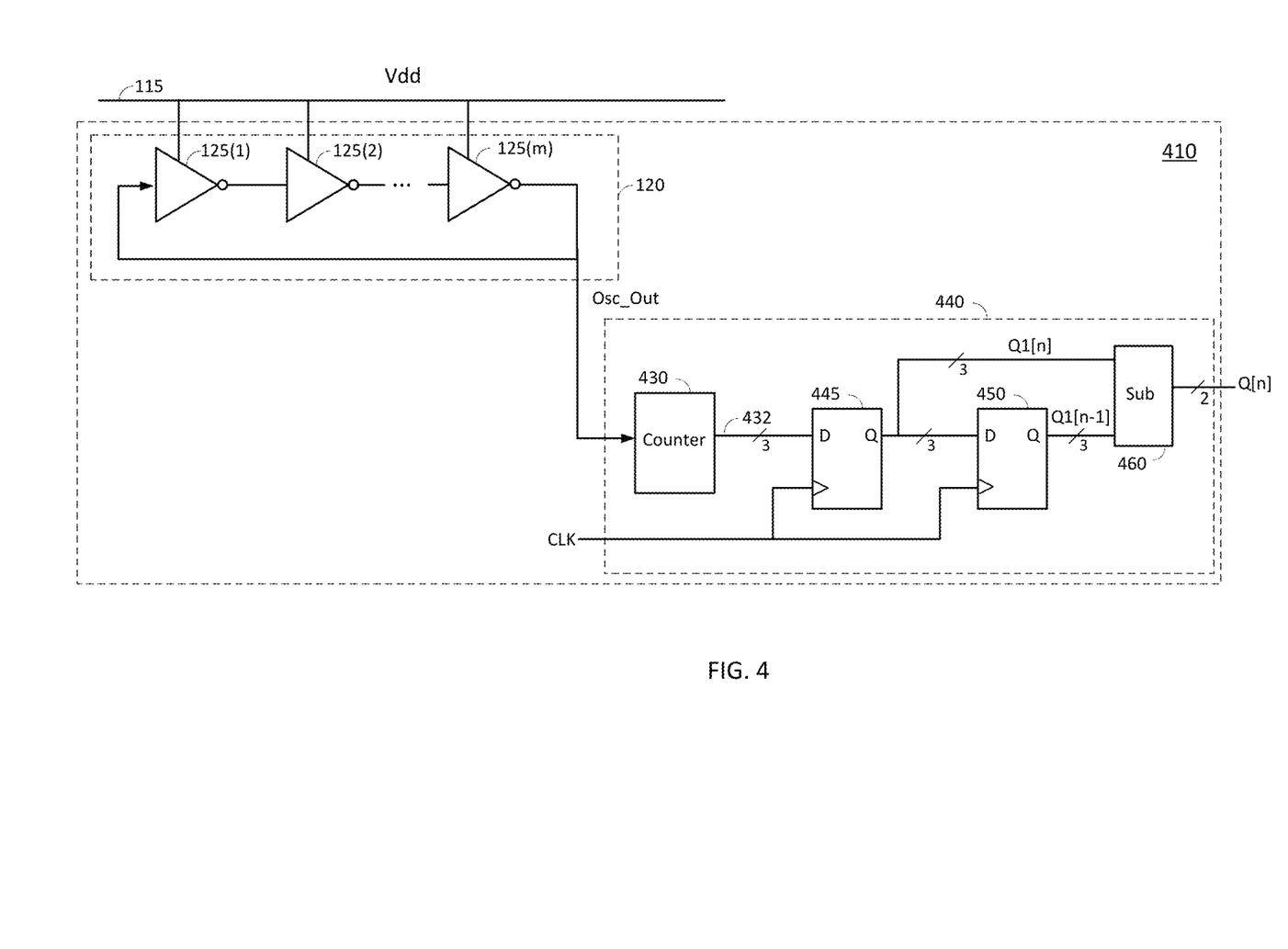
FIG. 4 shows an exemplary implementation of a transition detector according to another embodiment of the present disclosure.

FIG. 4 shows an exemplary implementation of a transition detector 440 according to another embodiment of the present disclosure. In this embodiment, the transition detector 440 is a two-bit transition detector capable of detecting up to three transitions during one clock cycle (period).

The transition detector 440 comprises a counter 430, a first 3-bit latch 445, a second 3-bit latch 450, and a subtractor 460. The counter 430 has an input coupled to the oscillator output Osc_Out, and is configured to count a number of rising edges at the oscillator output Osc_Out. In one aspect, the counter 430 may be a 3-bit counter capable of counting from zero to seven. The counter 430 may increment a count each time the counter 430 detects a rising edge at the oscillator output Osc_Out. When the count reaches seven, the counter 430 rolls over back to a count of zero for the next rising edge. The counter 430 outputs the count from a 3-bit output 432.

The first latch 445 has a 3-bit input (denoted "D") coupled to the output 432 of the counter 430, a clock input coupled to the clock signal, and a 3-bit output (denoted "Q"). The second latch 450 has a 3-bit input (denoted "D") coupled to the output of the first latch 445, a clock input coupled to the clock signal, and a 3-bit output (denoted "Q"). The subtractor 460 has a first 3-bit input coupled to the output of the first latch 445 and a second 3-bit input coupled to the output of the second latch 450. The subtractor 460 is configured to determine a difference between the outputs of the first and second latches 445 and 450, and output the difference as the output of the transition detector 440.

In one aspect, the first latch 445 is configured to latch the count from the counter 430 on each rising edge of the clock signal. The first latch 445 outputs each latched count at its output until the next rising edge of the clock signal (outputs each latched logic state for approximately one clock cycle). The second latch 450 is configured to latch the count at the output of the first latch 445 on each rising edge of the clock signal. The second latch 450 outputs each latched count at its output until the next rising edges of the clock signal. In this embodiment, the count is a 3-bit value, as discussed above.

On each rising edge of the clock signal, the first latch 445 latches the current count from the counter 430, and the second latch 450 latches the count that was latched by the first latch 445 on the previous rising edge of the clock signal. As a result, the difference between the counts output by the first and second latches 445 and 450 corresponds to the number of rising edges detected by the counter 430 over one clock cycle. Thus, the output of the subtractor 440 provides the number of detected rising edges at the oscillator output Osc_Out over one clock cycle.

In one aspect, the subtractor 460 has a 2-bit output. Thus, in this aspect, the output Q[n] of the transition detector 440 has a range of zero to three, and can therefore detect up to three rising edges at the oscillator output Osc_Out over one clock cycle. Since the transition detector 440 only detects rising edges in this embodiment, the output Q[n] of the transition detector 440 corresponds to a quantized phase of $2\pi Q[n]$, in which the phase of the oscillator 120 over one clock cycle is quantized to zero for Q[n] equal to zero, $2\pi$ for Q[n] equal to one, $4\pi$ for Q[n] equal to two, and $6\pi$ for Q[n] equal to three. As a result, the output Q[n] of the transition detector 240 is related to the supply voltage Vdd by the factor $K_{vdd}T$ with a quantization error, as shown in equation (10) discussed above. In this embodiment, the voltage-to-frequency coefficient $K_{vdd}$ of the oscillator 120 and/or the period of the clock signal may be chosen such that no more than three rising edges occur during one clock cycle over the voltage range of interest.

Figure 5:
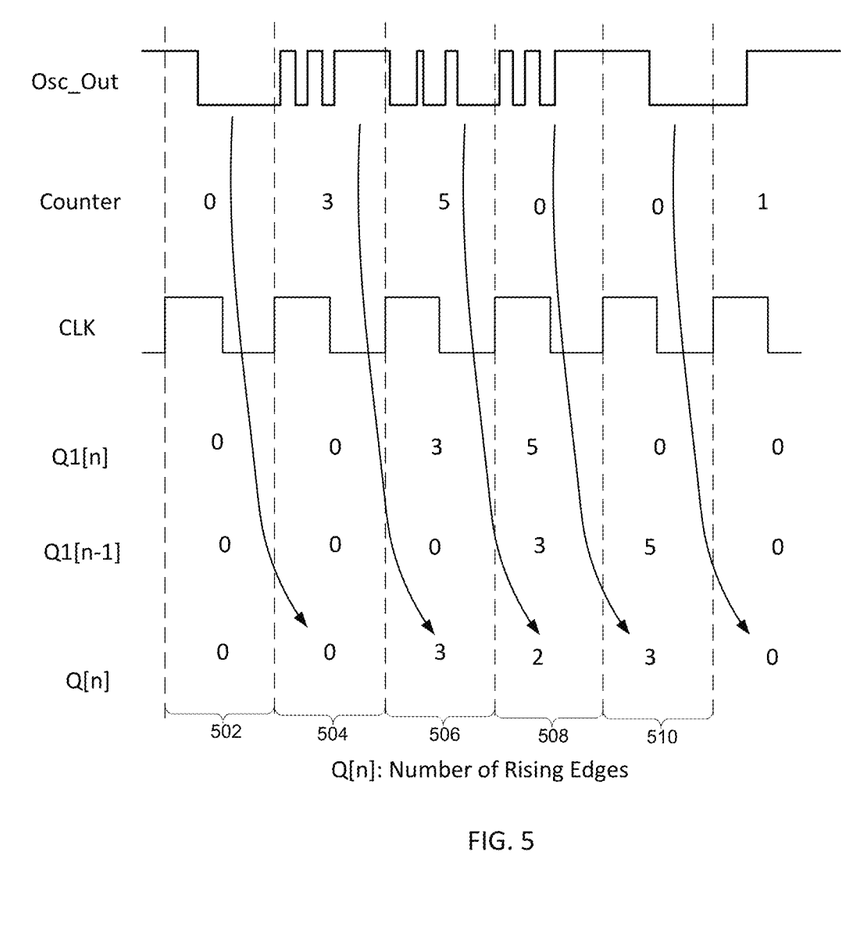
FIG. 5 is a plot illustrating exemplary waveforms for a voltage sensor according to another embodiment of the present disclosure.

FIG. 5 is a plot illustrating exemplary waveforms for the oscillator output Osc_Out, the output of the counter 430, the clock signal CLK, the output Q1[n] of the first latch 445, the output Q1[n−1] of the second latch 450, and the output Q[n] of the transition detector 440 according to an embodiment of the present disclosure. In this example, the counter 430 outputs a count of zero during a first clock cycle 502. During a second clock cycle 504, the counter 430 counts three rising edges at the oscillator output Osc_Out and outputs a count of three. This causes the first latch 445 to output a count of three during a third clock cycle 506. The second latch 450 outputs a count of zero during the third clock cycle 506 since the output of the second latch 450 lags behind the output of the first latch 445 by one clock cycle. As a result, the transition detector 440 outputs a value of three during the third clock cycle 506 corresponding to a quantized phase of $6\pi$.

During the third clock cycle 506, the counter 430 counts two rising edges at the oscillator output Osc_Out and increases the count to five. This causes the first latch 445 to output a count of five during a fourth clock cycle 508. The second latch 450 outputs a count of three during the fourth clock cycle 508 since the output of the second latch 450 lags behind the output of the first latch 445 by one clock cycle.

As a result, the transition detector 440 outputs a value of two during the fourth clock cycle 508 corresponding to a quantized phase of 4π.

During the fourth clock cycle 508, the counter 430 counts three rising edges at the oscillator output Osc_Out and outputs a count of zero. This is because the counter 430 reaches its count limit of seven for the second rising edge during the fourth clock cycle 508, and rolls over back to a count of zero for the third rising edge during the fourth clock cycle 508. During a fifth clock cycle 510, the first latch 445 outputs a count of zero, and the second latch 450 outputs a count of five. In this example, the subtractor 460 may be configured to recognize that the count from the second latch 450 is larger than the count from the first latch 445 because the count from the counter 430 rolled over, and compute the difference between the counts from first and second latches 445 and 450 accordingly. As a result, the subtractor 460 outputs a value of three during the fifth clock cycle 510 corresponding to a quantized phase of 6π.

The voltage sensor 410 in FIG. 4 allows the oscillator 120 to have a wider frequency range (tuning range) compared with the voltage sensor 210 in FIG. 2 for a given voltage range and clock cycle. This is because the transition detector 240 in FIG. 2 restricts the oscillator 120 to a frequency range that results in no more than one transition (rising edge or falling edge) during one clock cycle, while the transition detector 440 in FIG. 4 restricts the oscillator 120 to a much larger frequency range that results in no more than three rising edges during one clock cycle. Because the voltage sensor 410 in FIG. 4 allows a wider frequency range for the oscillator 120, the voltage sensor 410 allows the voltage-to-frequency coefficient $K_{vdd}$ of the oscillator 120 to be higher for a given voltage range and clock cycle. The higher voltage-to-frequency coefficient $K_{vdd}$ increases the sensitivity of the oscillator frequency to the supply voltage Vdd, providing higher voltage resolution.

Although the voltage sensor 410 in FIG. 4 provides higher voltage resolution than the voltage sensor 210 in FIG. 2, the voltage resolution of the voltage sensor 410 may still be too low for many applications (e.g., measuring a voltage waveform). This is because the transition detector 440 only detects up to three rising edges over one clock period, and, as a result, quantizes the phase of the oscillator 120 over one clock cycle to one of four values (e.g., zero, 2π, 4π, and 6π)

The voltage resolution of the transition detector 140 may be increased by increasing the length of one clock cycle and increasing the number of transitions that the transition detector 140 is able to detect over one clock cycle. However, increasing the length of one clock cycle reduces the time resolution of the voltage sensor 110, which may make the voltage sensor unsuitable for measuring fast voltage transients and/or high-frequency voltage noise (e.g., voltage noise in the Gigahertz range). This is because the output of the voltage sensor 110 for each clock cycle corresponds to the average supply voltage Vdd over the clock cycle. As a result, increasing the length of the clock cycle increases the time over which the supply voltage Vdd is averaged, thereby reducing time resolution.

The voltage resolution of the voltage sensor 110 may be increased without reducing time resolution by increasing the frequency of the oscillator 120 relative to the frequency of the clock signal and increasing the number of transitions that the transition detector 140 is able to detect over one clock cycle. A problem with this approach is that the frequency of the clock signal may already be relatively high in order to provide adequate time resolution for measuring fast voltage transients and/or high-frequency voltage noise. Because the clock frequency is already high, it may be difficult to make the frequency of the oscillator 120 sufficiently higher than the clock frequency to achieve a desired voltage resolution. For example, the frequency of the oscillator 120 may be limited by the process technology used to fabricate the voltage sensor 110.

Figure 6:
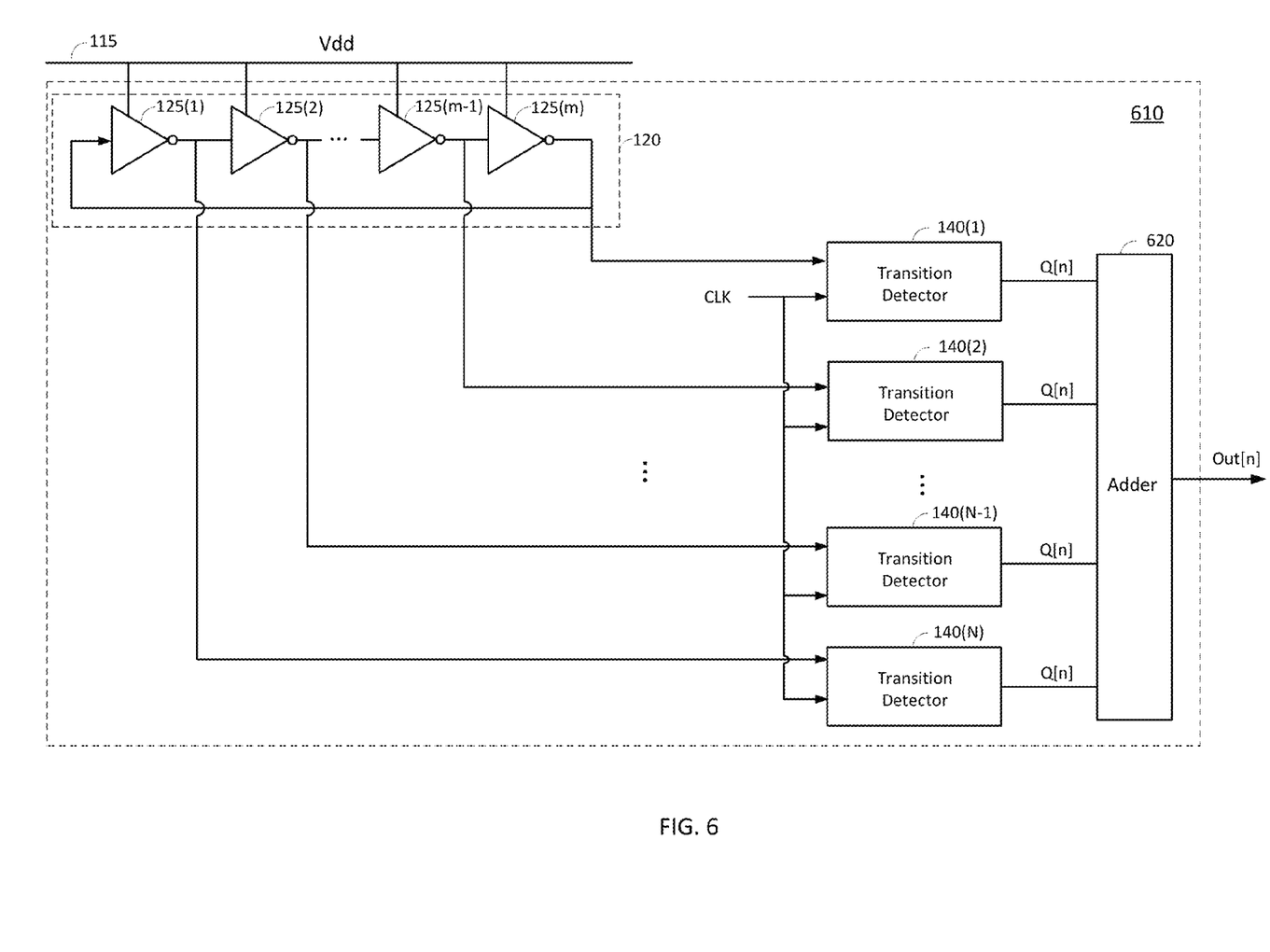
FIG. 6 shows a voltage sensor comprising a plurality of transition detectors according to an embodiment of the present disclosure.

In this regard, FIG. 6 shows a voltage sensor 610 according to an embodiment of the present disclosure that is able to achieve high voltage resolution and high time resolution at lower oscillation frequencies than the voltage sensors 210 and 410 in FIGS. 2 and 4. This is because the voltage sensor 610 detects transitions at multiple locations on the oscillator 120 instead of one location, as discussed further below.

The voltage sensor 610 comprises the oscillator 120, N transition detectors 140(1) to 140(N), and an adder 620. Each transition detector 140(1) to 140(N) may be implemented using the transition detector 240 in FIG. 2 or the transition detector 440 in FIG. 4. However, it is to be appreciated that the transition detectors 140(1) to 140(N) are not limited to these examples.

Each transition detector 140(1)-140(N) receives the clock signal CLK and is coupled to a different location on the oscillator 120. For example, each transition detector 140(1)-140(N) may be coupled to the output of a different inverter 125(1)-125(m) in the oscillator 120, as shown in FIG. 6. In this example, the number of inverters may equal the number of transition detectors. As a result, each transition detector 140(1)-140(N) detects transitions at a different location on the oscillator 120.

For each clock cycle, each transition detector 140(1)-140(N) outputs the number of detected transitions (denoted "Q[n]") at the respective location over the clock cycle. The adder 620 adds the outputs Q[n] of the transition detectors 140(1)-140(N), and outputs the resulting sum (denoted "Out[n]") as the output of the voltage sensor 610. Thus, the output Out[n] of the voltage sensor 610 is the total number of detected transitions at the different locations on the oscillator 120 over one clock cycle. The output Out[n] may be referred to as a count value indicating the number of detected transitions over the clock cycle.

The output Out[n] of the voltage sensor 610 provides finer phase quantization than the output Q[n] of each transition detector 140(1)-140(N). For example, if each transition detector 140(1)-140(N) only detects rising edges and provides a quantized phase of 2πQ[n] (as discussed above), then the output Out[n] of the voltage sensor 610 provides a quantized phase of (2π/N)Out[n], where N is the number of transition detectors 140(1)-140(N) in the voltage sensor 610. Thus, the space between quantized phase values is reduced from 2π for the output Q[n] of an individual transition detector to 2π/N for the output Out[n] of the voltage sensor 610. As a result, voltage sensor 610 provides higher voltage resolution with lower quantization error than an individual transition detector. This may be demonstrated by the following explanation.

In this example, the voltage sensor 610 detects N transitions per oscillation cycle. This is because each transition detector in the voltage sensor 610 detects one transition (a rising edge) per oscillation cycle and there are N transition detectors in the voltage sensor 610. The time delay between adjacent detected transitions in the voltage sensor 610 is approximately 2d, where d is the delay of one inverter. Since one oscillation cycle spans a time period of approximately 2Nd (two trips through the oscillator) and one oscillation cycle corresponds to a phase of 2π, the delay between adjacent detected transitions (i.e., 2d) corresponds to a phase of 2π/N. As a result, a detected transition in the voltage sensor 610 corresponds to a phase increase of 2π/N from the previously detected transition.

In this example, the quantized phase (2π/N)Out[n] corresponding to the output Out[n] of the voltage sensor 610 is related to the supply voltage Vdd by the factor $2\pi K_{vdd}T$. Thus, the output Out[n] of the voltage sensor 610 is related to the supply voltage Vdd by the factor $NK_{vdd}T$. Assuming the frequency-to-voltage coefficient $K_{vdd}$ and the cycle (period) T of the clock signal are relatively constant and quantization error is low, the output Out[n] of the voltage sensor 610 is approximately proportional to the supply voltage Vdd by the factor $NK_{vdd}T$.

For the example in which each transition detector 140(1)-140(N) detects both rising and falling edges and provides a quantized phase of πQ[n] (as discussed above), the output Out[n] of the voltage sensor 610 provides a quantized phase of (π/N)Out[n], where N is the number of transition detectors 140(1)-140(N) in the voltage sensor 610. Thus, the space between quantized phase values is reduced from π for the output Q[n] of an individual transition detector to π/N for the output Out[n] of the voltage sensor 610. This may be demonstrated by the following explanation.

In this example, the voltage sensor 610 detects 2N transitions per oscillation cycle. This is because each transition detector in the voltage sensor 610 detects two transitions (a rising edge and falling edge) per oscillation cycle and there are N transition detectors in the voltage sensor 610. The time delay between adjacent detected transitions in the voltage sensor 610 is approximately d, where d is the delay of one inverter. Since one oscillation cycle spans a time period of approximately 2Nd (two trips through the oscillator) and one oscillation cycle corresponds to a phase of 2π, the delay between adjacent detected transitions (i.e., d) corresponds to a phase of π/N. As a result, a detected transition in the voltage sensor 610 corresponds to a phase increase of π/N from the previously detected transition.

In this example, the quantized phase (π/N)Out[n] corresponding to the output of the voltage sensor 610 is related to the supply voltage Vdd by the factor $2\pi K_{vdd}T$. Thus, the output Out[n] of the voltage sensor 610 is related to the supply voltage Vdd by the factor $2NK_{vdd}T$. Assuming the frequency-to-voltage coefficient $K_{vdd}$ and the cycle (period) T of the clock signal are relatively constant and quantization error is low, the output Out[n] of the voltage sensor 610 is approximately proportional to the supply voltage Vdd by the factor $2NK_{vdd}T$.

Thus, the voltage sensor 610 is able to achieve high voltage resolution and high time resolution at lower oscillation frequencies than the voltage sensors 210 and 410 in FIGS. 2 and 4. This is because the output Out[n] of voltage sensor 610 provides finer phase quantization by detecting transitions at multiple locations on the oscillator 120 instead of one location. The finer phase quantization allows the voltage sensor 610 to achieve higher voltage resolution for a given clock cycle without having to increase the frequency of the oscillator 120.

Further, the voltage sensor 610 is able to sense voltage for oscillation frequencies that are lower than the clock frequency. For instance, for the example in which each transition detector 140(1)-140(N) detects two transitions (a rising edge and a falling edge) per oscillation cycle, the voltage sensor 610 detects 2N transitions per oscillation cycle. If the oscillation frequency is half the clock frequency, then the voltage sensor may detect N transitions over one clock cycle, which may provide adequate voltage resolution for certain applications.

Figure 7:
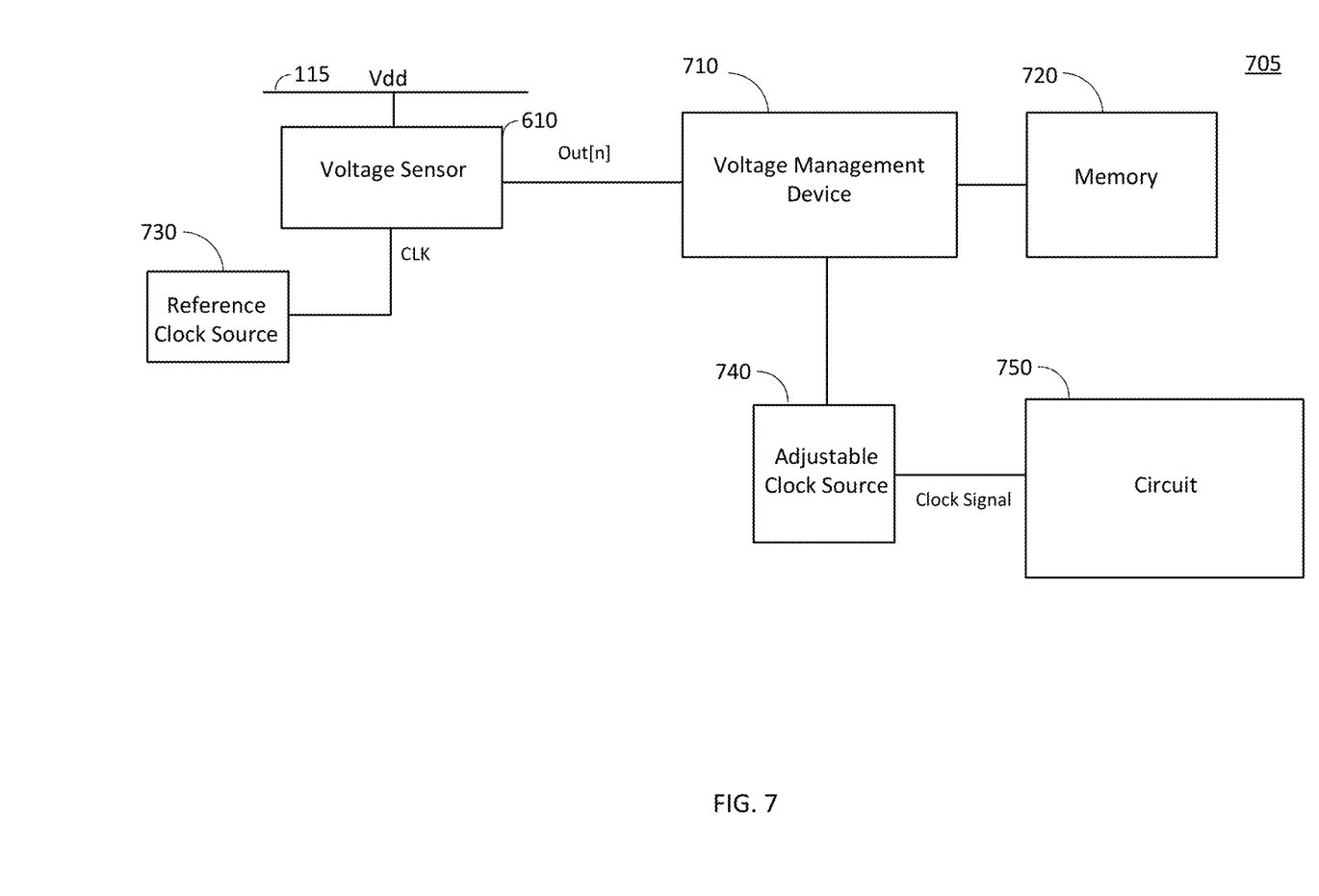
FIG. 7 shows a system comprising a voltage sensor according to an embodiment of the present disclosure.

As discussed above, the voltage sensor 610 may be used to measure voltage waveforms on the power supply rail 115. In this regard, FIG. 7 shows a system 705 comprising the voltage sensor 610, a voltage management device 710, a memory 720, and a reference clock source 730. The reference clock source 730 provides the reference clock signal CLK discussed above, and may comprise a PLL and/or a crystal oscillator. It is to be appreciated that the voltage sensor 610 in FIG. 7 is not drawn to scale, and may be much smaller than the voltage management device 710.

In this embodiment, the voltage sensor 610 may be used to measure a voltage waveform on the power supply rail 115. For example, for each one of a plurality of clock cycles, the voltage sensor 610 may output a count value indicating the number of detected transitions over the clock cycle. The plurality of clock cycles may span a time interval over which the voltage waveform is to be measured. The voltage waveform may comprise a voltage droop, high-frequency voltage noise, or other waveform of interest.

As discussed above, the number of detected transitions over a clock cycle is approximately proportional to the average voltage on the power supply rail 115 over the clock cycle. Thus, the count value for each clock cycle is approximately proportional to the average voltage over the clock cycle. The voltage sensor 610 may sequentially output the count value for each clock cycle to the voltage management device 710. The voltage management device 710 may store the count values in the memory 720. The memory 720 may comprise a first in, first out (FIFO) memory or other type of memory. The count values may be read out from the memory 720 and sent to a processor configured to process the count values into a measured voltage waveform. For example, the processor may convert each count value to a voltage measurement based on the corresponding factor (e.g., $2NK_{vdd}T$) relating the count value to voltage. The measured voltage waveform may then be analyzed, for example, by software and/or engineer.

Figure 8:
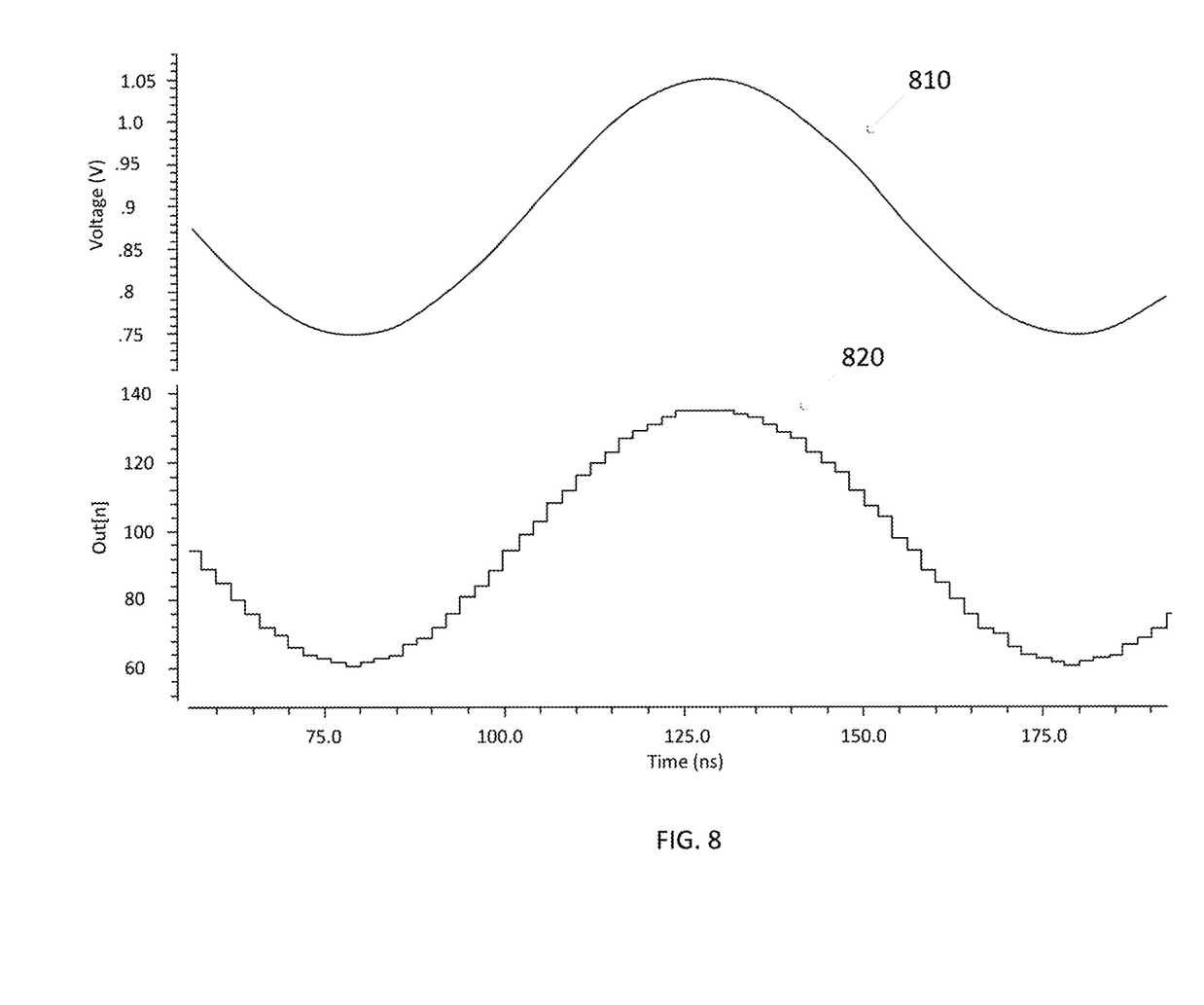
FIG. 8 shows an example of a voltage waveform measurement according to an embodiment of the present disclosure.

In this regard, FIG. 8 shows an example of a voltage waveform 810 input to the voltage sensor 610 from the power supply rail 115, and the corresponding count values 820 output by the voltage sensor 610. As shown in FIG. 8, the count values provide a digital representation of the voltage waveform 810, in which each count value represents a sample of the voltage waveform 820 sampled at the reference clock frequency.

The voltage readings from the voltage sensor 610 may also be used for adaptive clocking to prevent the supply voltage from becoming too low. In this regard, the system 705 may further include an adjustable clock source 740, and a circuit 750 (e.g., CPU). The adjustable clock source 740 may provide an operating clock signal to the circuit 750, which the circuit 750 may use for data sampling, data processing, timing digital logic, etc. The adjustable clock source 740 (e.g., PLL) is configured to adjust the frequency of the operating clock signal under the control of the voltage management device 710.

In one example, the circuit 750 may be coupled to the power supply rail 115 (not shown in FIG. 7). In this example, the frequency of the clock signal input to the circuit 750 determines the switching frequency of logic in the circuit 750, which in turn determines the current load of the circuit 750 on the power supply rail 115. The higher the switching frequency, the greater the current load.

In this example, the voltage management device 710 may monitor the supply voltage Vdd using the voltage sensor 610, and compare the monitored voltage to a voltage threshold. The voltage threshold may be equal to the sum of a voltage margin and the minimum supply voltage needed by circuits coupled to the power supply rail 115 to function properly. If the monitored voltage falls below the voltage threshold, then the voltage management device 710 may reduce (throttled back) the frequency of the clock signal from the adjustable clock source 740 to increase the supply voltage. This is because reducing the clock frequency reduces the switching frequency of the circuit 750, which in turn reduces the current load of the circuit 750 on the power supply rail 115. The reduced current load allows the supply voltage to increase.

Although one voltage sensor 610 is shown in FIG. 7 for ease of illustration, it is to be appreciated that the system 705 may comprise a plurality of voltage sensors, for example, to measure voltage waveforms at different locations on a chip. In this example, each of the voltage sensors may be implemented using the voltage sensor 610 in FIG. 6.

It is to be appreciated that embodiments of the present disclosure are not limited to the examples discussed above. For instance, it is to be appreciated that embodiments of the present disclosure are not limited to the exemplary ring oscillator shown in FIG. 6, and that other types of voltage-controlled oscillators may be used. Further, it is to be appreciated that the transition detector 440 in FIG. 4 is not limited to detecting rising edges. For example, the counter 430 may be configured to count both rising and falling edges. Also, the first and second latches 445 and 450 in FIG. 4 are not limited to three bits. For example, the number of bits that each latch can handle may be increased to increase the number transitions that can be detected by the transition detector over one clock cycle.

Figure 9:
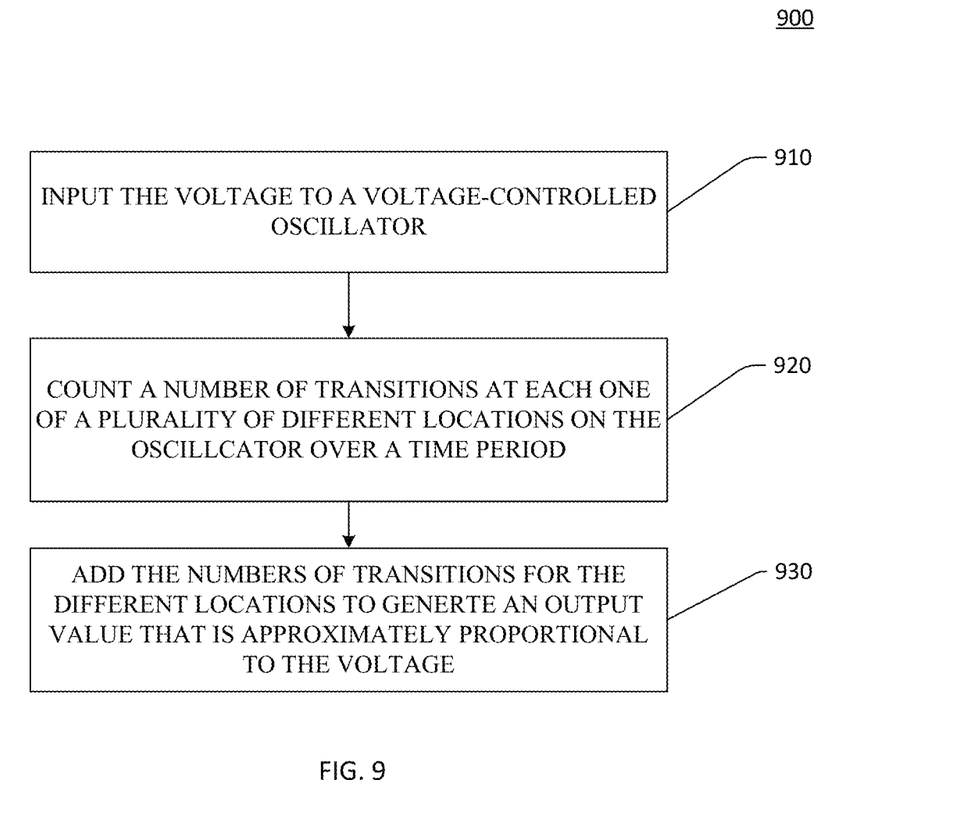
FIG. 9 is a flowchart of a method for sensing a voltage according to an embodiment of the present disclosure.

FIG. 9 is a flowchart illustrating a method 900 for sensing a voltage according to an embodiment of the present disclosure. The method 900 may be performed by the voltage sensor 610 in FIG. 6.

In step 910, the voltage is input to a voltage-controlled oscillator. For example, the voltage may be a voltage of a power supply rail (power supply rail 115), and the oscillator may comprise a ring oscillator (e.g., ring oscillator 120).

In step 920, a number of transitions is counted at each one of a plurality of different locations on the oscillator over a time period. For example, the oscillator may comprise a plurality of inverters (e.g., inverts 125(1)-125(m)) coupled into a loop, in which each location corresponds to an output of a different one of the inverters. The time period may corresponds a cycle of a clock signal. If no transition is detected at a particular one of the locations over the time period, then the count for that location may equal zero.

In step 930, the numbers of transitions for the different locations are added to generate an output value that is approximately proportional to the voltage. For example, the output value may be approximately linearly related to the voltage by a factor (e.g., $2NK_{vdd}T$ or $NK_{vdd}T$).

Those skilled in the art would appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the disclosure herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection may be properly termed a computer-readable medium to the extent involving non-transient storage of transmitted signals. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium, to the extent the signal is retained in the transmission chain on a storage medium or device memory for any non-transient length of time. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A voltage sensor, comprising:
   a voltage-controlled oscillator coupled to a voltage being sensed;
   a plurality of transition detectors, wherein each of the transition detectors is coupled to a different location on the oscillator, and wherein each of the transition detectors is configured to count a number of transitions at the respective location over a time period; and
   an adder configured to add the numbers of transitions from the transition detectors to generate an output value that is approximately proportional to the voltage.

2. The voltage sensor of claim 1, wherein the oscillator comprises a plurality of inverters coupled into a loop, each of the inverters is biased by the voltage, and each of the transition detectors is coupled to an output of a different one of the inverters.

3. The voltage sensor of claim 2, wherein each of the transition detectors is configured to count transitions corresponding to rising edges at the respective location.

4. The voltage sensor of claim 2, wherein each of the transition detectors is configured to count transitions corresponding to rising edges and falling edges at the respective location.

5. The voltage sensor of claim 1, wherein each of the transition detectors is configured to receive a clock signal, and the time period comprises a cycle of the clock signal.

6. The voltage sensor of claim 5, wherein each of the transition detectors comprises:
   a counter configured to count transitions at the respective location on the oscillator, and to output a count of the transitions;
   a first latch configured to latch a current count from the counter on a current edge of the clock signal;
   a second latch configured to latch a previous count that was latched by the first latch from the counter on a previous edge of the clock signal; and
   a subtractor configured to compute a difference between the current count latched by the first latch and the previous count latched by the second latch.

7. The voltage sensor of claim 6, wherein the counter in each transition detector is configured to count transitions corresponding to rising edges at the respective location on the oscillator.

8. The voltage sensor of claim 6, wherein the counter in each transition detector is configured to count transitions corresponding to rising edges and falling edges at the respective location on the oscillator.

9. The voltage sensor of claim 5, wherein each of the transition detectors comprises:
   a first latch configured to latch a current logic state at the respective location on the oscillator on a current edge of the clock signal;
   a second latch configured to latch a previous logic state at the respective location on the oscillator, wherein the previous logic state was latched by the first latch on a previous edge of the clock signal; and
   an XOR gate configured to output a logic one if the current and previous logic states are different, the logic one being indicative of one detected transition at the respective location.

10. The voltage sensor of claim 1, wherein the voltage is a voltage of a power supply rail.

11. The voltage sensor of claim 1, wherein each of the transition detectors comprises a counter configured to count transitions at the respective location on the oscillator.

12. The voltage sensor of claim 11, wherein the counter is a multiple bit counter.

13. A method for sensing a voltage, comprising:
    inputting the voltage to a voltage-controlled oscillator;
    counting a number of transitions at each one of a plurality of different locations on the oscillator over a time period; and
    adding the numbers of transitions for the different locations to generate an output value that is approximately proportional to the voltage.

14. The method of claim 13, wherein the oscillator comprises a plurality of inverters coupled into a loop, each of the inverters is biased by the voltage, and each of the locations corresponds to an output of a different one of the inverters.

15. The method of claim 13, wherein counting the number of transitions at each location comprises detecting rising edges at each location.

16. The method of claim 13, wherein counting the number of transitions at each location comprises detecting rising edges and falling edges at each location.

17. The method of claim 13, further comprising receiving a clock signal, wherein the time period comprises a cycle of the clock signal.

18. The method of claim 13, wherein the counting of the number of transitions at each one of the plurality of different locations on the oscillator is performed by a plurality of transition detectors each including a counter configured to count transitions at the respective location on the oscillator.

19. The method of claim 18, wherein the counter is a multiple bit counter.

20. An apparatus for sensing a voltage, comprising:
    means for inputting the voltage to a voltage-controlled oscillator;
    means for counting a number of transitions at each one of a plurality of different locations on the oscillator over a time period; and
    means for adding the numbers of transitions for the different locations to generate an output value that is approximately proportional to the voltage.

21. The apparatus of claim 20, wherein the oscillator comprises a plurality of inverters coupled into a loop, each of the inverters is biased by the voltage, and each of the locations corresponds to an output of a different one of the inverters.

22. The apparatus of claim 20, wherein the means for counting the number of transitions at each location comprises means for detecting rising edges at each location.

23. The apparatus of claim 20, wherein the means for counting the number of transitions at each location comprises means for detecting rising edges and falling edges at each location.

24. The apparatus of claim 20, further comprising means for receiving a clock signal, wherein the time period comprises a cycle of the clock signal.

25. The apparatus of claim 20, wherein the means for counting a number of transitions includes a plurality of transition detectors wherein each of the transition detectors comprises a counter configured to count transitions at the respective location on the voltage-controlled oscillator.

26. The apparatus of claim 25, wherein the counter is a multiple bit counter.

27. A system, comprising:
a voltage sensor, the voltage sensor comprising:
a voltage-controlled oscillator coupled to a voltage being sensed;
a plurality of transition detectors, wherein each of the transition detectors is coupled to a different location on the oscillator, and wherein each of the transition detectors is configured to count a number of transitions at the respective location over a time period; and
an adder configured to add the numbers of transitions from the transition detectors to generate an output value that is approximately proportional to the voltage; and
a voltage management device configured to estimate the voltage based on the output value, and to adjust an operating frequency of a circuit based on the estimated voltage.

28. The system of claim 27, wherein the voltage management device is configured to compare the estimated voltage with a voltage threshold, and to reduce the operating frequency of the circuit if the estimated voltage is below the voltage threshold.

29. The system of claim 28, wherein each of the transition detectors is configured to receive a clock signal, and the time period comprises a cycle of the clock signal.

30. The system of claim 28, wherein the voltage is a voltage of a power supply rail, and the circuit is coupled to the power supply rail.

31. The system of claim 27, wherein the oscillator comprises a plurality of inverters coupled into a loop, each of the inverters is biased by the voltage, and each of the transition detectors is coupled to an output of a different one of the inverters.

32. The system of claim 31, wherein each of the transition detectors is configured to count transitions corresponding to rising edges at the respective location.

33. The system of claim 31, wherein each of the transition detectors is configured to count transitions corresponding to rising edges and falling edges at the respective location.

34. The system of claim 27, wherein each of the transition detectors comprises a counter configured to count transitions at the respective location on the oscillator.

35. The system of claim 34, wherein the counter is a multiple bit counter.

* * * * *